United States Patent [19]

Headen, Jr.

[11] Patent Number: 5,341,038

[45] Date of Patent: Aug. 23, 1994

[54] ERROR DETECTOR CIRCUIT FOR INDICATION OF LOW SUPPLY VOLTAGE

[75] Inventor: William E. Headen, Jr., North Kingstown, R.I.

[73] Assignee: Cherry Semiconductor Corporation, East Greenwich, R.I.

[21] Appl. No.: 825,977

[22] Filed: Jan. 27, 1992

[51] Int. Cl.$^5$ .............................. H03K 5/24; H03K 3/33
[52] U.S. Cl. .................................. 307/359; 307/255; 307/296.4; 307/300; 307/363
[58] Field of Search .................. 307/254, 255, 296.1, 307/296.4, 296.6, 300, 350, 354, 358, 359, 360, 362, 363; 340/662, 663

[56] References Cited

U.S. PATENT DOCUMENTS

| | | | |
|---|---|---|---|
| 3,231,752 | 1/1966 | Jacob | 307/300 |
| 3,588,538 | 6/1971 | Picillo | 307/254 |
| 3,588,544 | 6/1971 | Wallingford | 307/300 |
| 4,086,503 | 4/1978 | Fox et al. | 307/254 |
| 4,237,388 | 12/1980 | Nokubo et al. | 307/300 |
| 4,371,792 | 2/1983 | Dobkib | 307/255 |
| 4,598,213 | 7/1986 | Marley et al. | 307/255 |
| 4,827,156 | 5/1989 | O'Neill | 307/255 |
| 4,967,106 | 10/1990 | Tamegaya | 307/363 |
| 5,159,211 | 10/1992 | Fujii | 307/351 |
| 5,248,932 | 9/1993 | Prentice | 307/254 |

*Primary Examiner*—Timothy P. Callahan
*Assistant Examiner*—Terry D. Cunningham
*Attorney, Agent, or Firm*—Robert M. Asher

[57] ABSTRACT

An error detection circuit having an output transistor of one conductivity type and a sense transistor and error detector transistor of an opposite conductivity type. An input voltage is provided at the collector of the output transistor and an output voltage is taken from the emitter of the output transistor. An emitter of the sense transistor is connected to the input voltage and the collector of the sense transistor is connected to the base of the output transistor. An emitter of the error detector transistor is connected to the collector of the sense transistor and a base of the error detector transistor is connected to the base of the sense transistor. The error detector transistor conducts when the sense transistor saturates indicating that the input voltage and output voltage have come within a predetermined voltage of one another.

11 Claims, 1 Drawing Sheet

ERROR DETECTOR CIRCUIT FOR INDICATION OF LOW SUPPLY VOLTAGE

BACKGROUND OF INVENTION

The present invention is directed to circuits for detecting error conditions such as low supply voltage, a regulator running out of head room or an op amp reaching its maximum output voltage.

Conventional circuits for detecting a low voltage condition generally include the use of comparators or reference voltages or currents. It is an object of the present invention to accomplish the production of an error signal with a more simplified scheme.

In digital applications, when the regulator collapses, it is desirable to provide a reset signal to the appropriate logic device, such as the microprocessor. It is an object of the present invention to provide such a signal without the use of comparators or references.

SUMMARY OF THE INVENTION

The present invention is an error detection circuit that includes an output transistor. The output voltage is taken from the emitter of the output transistor. A sense transistor is arranged with its collector connected to the base of the output transistor and its emitter connected to receive an input voltage. The input voltage is also connected to the collector of the output transistor. An error detector transistor has an emitter connected to the collector of the sense transistor, a base connected to the base of the sense transistor and a collector which provides a signal indicating an error. The application circuit in which the error detector circuit is used is connected in a feedback loop between the emitter of the output transistor and the base of the sense transistor. The error signal will be triggered if the input voltage drifts to within a predetermined voltage of the output voltage as set by the sense transistor and the output transistor. The error detector transistor is turned on when the sense transistor saturates. The sense transistor advantageously saturates before the output transistor saturates so as to alert the circuitry to the error condition before the output transistor saturates.

DETAILED DESCRIPTION OF PREFERRED EMBODIMENTS

Figure 1:
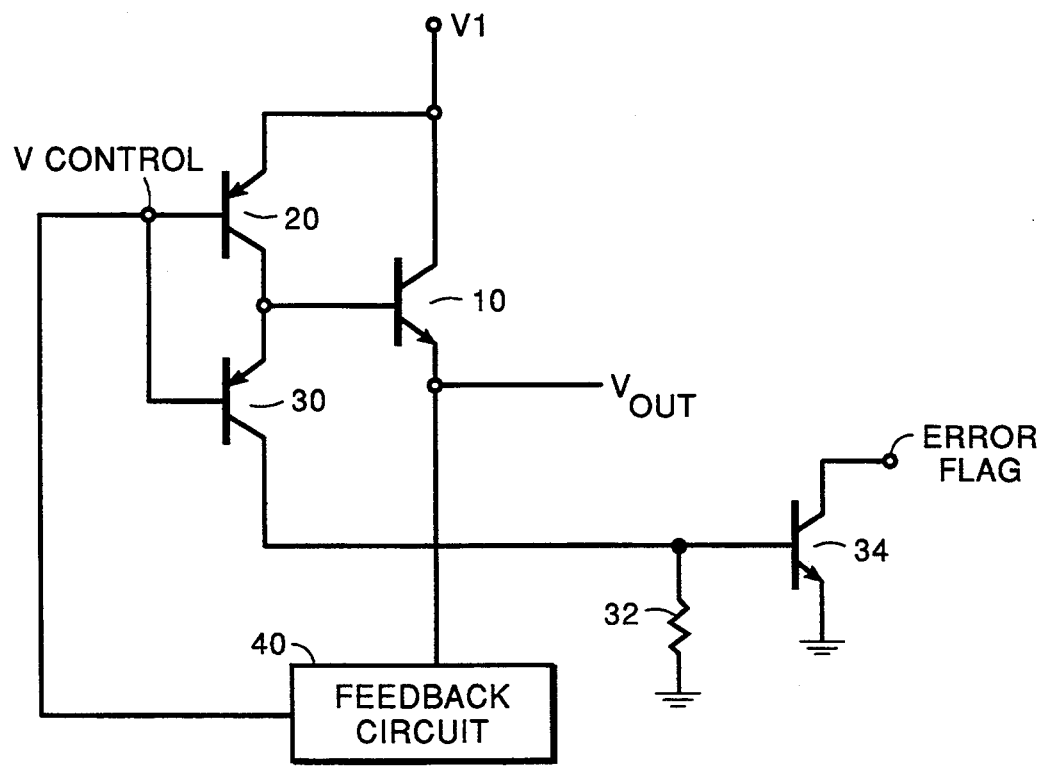
FIG. 1 is a schematic diagram of a first embodiment of the present invention.

Referring now to FIG. 1, a circuit of the present invention shall be described. The error detection circuit is formed using an output transistor 10, a sense transistor 20 and a error detector transistor 30. The sense transistor and the error detector transistor are of an opposite conductivity type from the output transistor. In FIG. 1, sense transistor 20 and error detector transistor 30 are PNP transistors and output transistor 10 is an NPN transistor. The collector of the output transistor 10 is connected through a terminal or conductive line to an input voltage V1. The input voltage may be a supply voltage or another voltage of concern. The error detector is used to detect when the input voltage and an output voltage $Y_{out}$ taken at the emitter of the output transistor become too close to one another. The output voltage may be accessed through a terminal or conductive output line.

The sense transistor 20 has its emitter connected to the input voltage V1. The collector of the sense transistor 20 is connected to the base of the output transistor 10. The error detector transistor 30 has its base connected to the base of the sense transistor 20 and its emitter connected to the collector of the sense transistor 20. The collector of the error detector transistor 30 provides an error signal when the sense transistor 20 saturates. The application circuit, in which the error detection circuit is being used, is hooked up as a feedback circuit between the output voltage $V_{out}$ and the input to the bases of sense transistor 20 and error detector transistor 30. The feedback circuit 40 may be any of a number of applications including an op amp or voltage regulator. In a voltage regulator, the output voltage is monitored by the feedback circuit 40 and a controlled voltage provided to the base of the sense transistor 20. The controlled voltage is received at the base of the sense transistor 20 through a terminal or a conductive line connected to the feedback circuit 40.

When the error detector transistor 30 conducts current through its collector, an error condition is indicated. In order to provide a signal that can be read by the digital circuitry, a resistor 32 may be connected between the collector of error detector transistor 30 and ground. This converts the current signal into a voltage that may be used to indicate an error condition. In addition or as an alternative, a flag transistor 34 can be connected with its base to the collector of the error detector circuit 30 so that the current signal from the error detector transistor 30 is used to turn on the flag transistor 34. By connecting the emitter of the flag transistor 34 to ground, the collector of flag transistor 34 will go to ground in response to an error detection signal. Thus, the signal from the error detector transistor 30 may be used to trigger a high flag at the resistor 32 or a low flag at the collector of the flag transistor 34.

The operation of the error detector circuit of the present invention is now described. Under normal operation, the error detector transistor 30 is off. This is because normally the difference between the input voltage and the output voltage is greater than the $V_{BE}$ of the output transistor plus the $V_{SAT}$ of the sense transistor 20. Thus, normally the sense transistor 20 is not saturated. The sense transistor 20, the output transistor 10 and the feedback circuit 40 are all used to generate the output voltage $V_{out}$. Proper operation of the circuits require that the input voltage V1 have a sufficient amplitude.

When the voltage between the input voltage and the output voltage drops either due to a drop in the input voltage or an undesired rise in the output voltage, an error will be indicated when the difference between the input and output voltages drops below a $V_{BE}$ plus a $V_{SAT}$. When the difference between the voltages gets this low, the sense transistor 20 saturates thereby turning on the error detector transistor 30. When error transistor 30 turns on, it provides a current signal to the resistor 32 and flag transistor 34 thereby generating the error flag. When sense transistor 20 saturates, the emitter base junction of error detector transistor 30 becomes forward biased causing collector current to flow through the error detector transistor 30. The error flag at the collector of transistor 34 goes to ground when the current from the collector of the error detector transistor 30 is sufficient to forward bias the flag transistor's emitter base junction.

It should be understood that the sense transistor 20 could be made to saturate even sooner by inserting an additional transistor or diode between the collector of the sense transistor 20 and the base of output transistor 10. The error condition is advantageously flagged before the output transistor 10 saturates.

Figure 2:
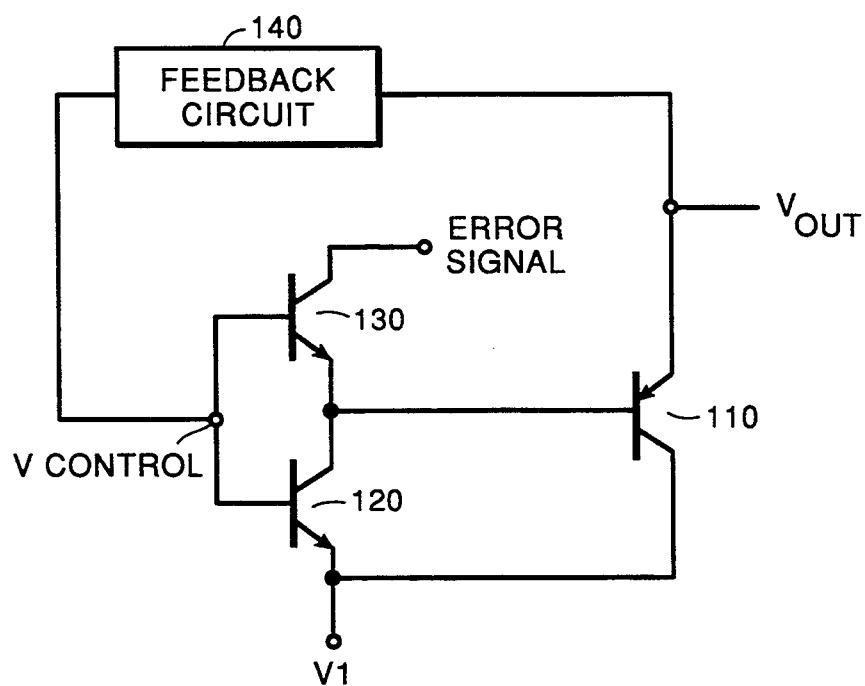
FIG. 2 is a schematic diagram of a second embodiment of the present invention.

Referring now to FIG. 2, the present invention is implemented with transistors of opposite conductivity type. In FIG. 2, corresponding components are shown with labels that are 100 greater than the labels shown in FIG. 1. In FIG. 2, the sense transistor 120 and error detector transistor 130 are of the same conductivity type. They are both NPN transistors. The output transistor 110 is of opposite conductivity type it is a PNP transistor. The operation of the circuit is similar to the operation for the circuit of FIG. 1.

Of course, it should be understood that various changes and modifications to the preferred embodiments described above will be apparent to those skilled in the art. For example, adding an additional sense transistor or diode can be included to trigger an error condition earlier than in the embodiments shown. These and other changes can be made without departing from the spirit and the scope of the invention and without diminishing its attendant advantages. It is therefore intended that such changes and modifications be covered by the following claims.

I claim:

1. An error detection circuit comprising:
input means for receiving an input voltage;
an output transistor having a collector connected to said input means, an emitter having an output voltage and a base;
sense transistor means having an emitter connected to said input means, a collector connected to the base of said output transistor and a base;
a feedback circuit connected so as to monitor the output voltage at the emitter of said output transistor and to provide a controlled voltage to the base of said sense transistor means; and
an error detector transistor having an emitter connected to the collector of said sense transistor means, a base connected to the base of said sense transistor means and a collector which provides a signal if said input voltage and said output voltage come within a predetermined voltage of one another.

2. The error detection circuit of claim 1 further comprising a flag transistor having a base connected to the collector of said error detector transistor, an emitter connected to ground and a collector such that the signal from said error detector transistor causes the collector of said flag transistor to go to ground.

3. The error detection circuit of claim I wherein said error detector transistor and said sense transistor means are of a first conductivity type and said output transistor is a conductivity type opposite of said first conductivity type.

4. The error detection circuit of claim 3 wherein said first conductivity type is PNP.

5. The error detection circuit of claim 3. wherein said first conductivity type is NPN.

6. A saturation sensing circuit comprising:
input means for receiving an input voltage;
output means for providing an output voltage;
an output transistor having a collector connected to said input means, an emitter connected to said output means and a base;
control voltage means for providing a control voltage;
a sense transistor having an emitter connected to said input means, a collector connected to the base of said output transistor and a base connected to said control voltage means; and
an error detector transistor having an emitter connected to the collector of said sense transistor, a base connected to said control voltage means and a collector which provides a current signal if said sense transistor saturates.

7. The saturation sensing circuit of claim 6 further comprising a flag transistor having a base connected to the collector of said error detector transistor, an emitter connected to ground and a collector such that the signal from said error detector transistor causes the collector of said flag transistor to go to ground.

8. The saturation sensing circuit of claim 6 wherein said error detector transistor and said sense transistor are of a first conductivity type and said output transistor is a conductivity type opposite of said first conductivity type.

9. The saturation sensing circuit of claim 8 wherein said first conductivity type is PNP.

10. The saturation sensing circuit of claim 8 wherein said first conductivity type is NPN.

11. The saturation sensing circuit of claim 6 further comprising a feedback circuit connected between said output means and said control voltage means.

* * * * *

UNITED STATES PATENT AND TRADEMARK OFFICE
CERTIFICATE OF CORRECTION

PATENT NO. : 5,341,038
DATE : August 23, 1994
INVENTOR(S) : William E. Headen, Jr.

It is certified that error appears in the above-identified patent and that said Letters Patent is hereby corrected as shown below:

Column 4, line 7   "claim I " should be --claim 1--.
Column 4, line 14  "claim 3." should be --claim 3--.

Signed and Sealed this

Twenty-second Day of November, 1994

Attest:

BRUCE LEHMAN

Attesting Officer        Commissioner of Patents and Trademarks